United States Patent
MacKenna et al.

(10) Patent No.: US 8,229,056 B2
(45) Date of Patent: Jul. 24, 2012

(54) UNIVERSAL COUNTER/TIMER CIRCUIT

(75) Inventors: Craig A. MacKenna, Los Gatos, CA (US); Neil E. Birns, Cupertino, CA (US)

(73) Assignee: NXP B.V., Eindhoven (NL)

( * ) Notice: Subject to any disclaimer, the term of this patent is extended or adjusted under 35 U.S.C. 154(b) by 47 days.

(21) Appl. No.: 12/972,392

(22) Filed: Dec. 17, 2010

(65) Prior Publication Data

US 2012/0155603 A1 Jun. 21, 2012

(51) Int. Cl.
*G06M 3/02* (2006.01)
(52) U.S. Cl. .................. 377/2; 377/25; 377/118
(58) Field of Classification Search .................... None
See application file for complete search history.

(56) References Cited

U.S. PATENT DOCUMENTS

| 4,355,378 | A | * | 10/1982 | Dennis et al. | 367/33 |
| 5,638,418 | A | * | 6/1997 | Douglass et al. | 377/25 |
| 2004/0004807 | A1 | * | 1/2004 | Kim et al. | 361/600 |
| 2008/0222400 | A1 | * | 9/2008 | Becker et al. | 712/225 |

* cited by examiner

*Primary Examiner* — Tuan T Lam

(57) ABSTRACT

A counter/timer circuit and method of generating timed output signals using the counter/timer circuit, uses multiple counters that are configurable to operate as one or more counters. The counters are controlled by control signals from a control logic circuitry of the counter/timer circuit, where at least some of the control signals are dependent on event signals generated by an event generation module of the counter/timer circuit. The generated event signals are based on at least one of: an input signal, an output signal, and a counter match, qualified by a state value associated with the counters.

20 Claims, 11 Drawing Sheets

UNIVERSAL COUNTER/TIMER CIRCUIT

There are various circuits that can provide timing information, counting information, output signal modulation and/or input capture results.

However, these circuits are typically designed for specific applications, such as motor control. Thus, for each new application, a unique circuit must be designed to perform the required operations for that application, which adds significant cost to the end product.

Therefore, there is a need for a circuit that can be used in different applications, and thus, eliminating the need to design a new circuit for each of the different applications.

A counter/timer circuit and method of generating timed output signals using the counter/timer circuit, uses multiple counters that are configurable to operate as one or more counters. The counters are controlled by control signals from a control logic circuitry of the counter/timer circuit, where at least some of the control signals are dependent on event signals generated by an event generation module of the counter/timer circuit. The generated event signals are based on at least one of: an input signal, an output signal, and a counter match, qualified by a state value associated with the counters.

A counter/timer circuit in accordance with an embodiment comprises a counter unit, a state logic module, an event generation module and control logic circuitry. The counter unit has multiple stages that are configurable to operate as one or more counters. The state logic module is configured to maintain a state value for each counter. The state value is used to indicate the current state of the application of that counter. The event generation module is configured to generate event signals based on at least one of: an input signal, an output signal, and a counter match, qualified by one of the state values. The control logic circuitry is connected to the counter unit to provide control signals for the counters of the counter unit. The control logic circuitry is also connected to the event generation module to receive the event signals so that at least some of the control signals are dependent on at least some of the event signals.

A method of generating timed output signals, using a counter/timer circuit in accordance with an embodiment of the invention, comprises receiving input signals at the counter/timer circuit, maintaining a state value for each counter of the counter/timer circuit, the state value being used to indicate the current state of the application of that counter, generating event signals based on at least one of: an input signal, an output signal of the counter/timer circuit, and a counter match, qualified by one of the state values associated with the counters, providing control signals to the counters of the counter/timer circuit, wherein at least some of the control signals are dependent on at least some of the event signals, and generating count values at the counters using the control signals, the count values representing a unified count value or separate count values depending on the configuration of the counter/timer circuit.

Other aspects and advantages of the present invention will become apparent from the following detailed description, taken in conjunction with the accompanying drawings, illustrated by way of example of the principles of the invention.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
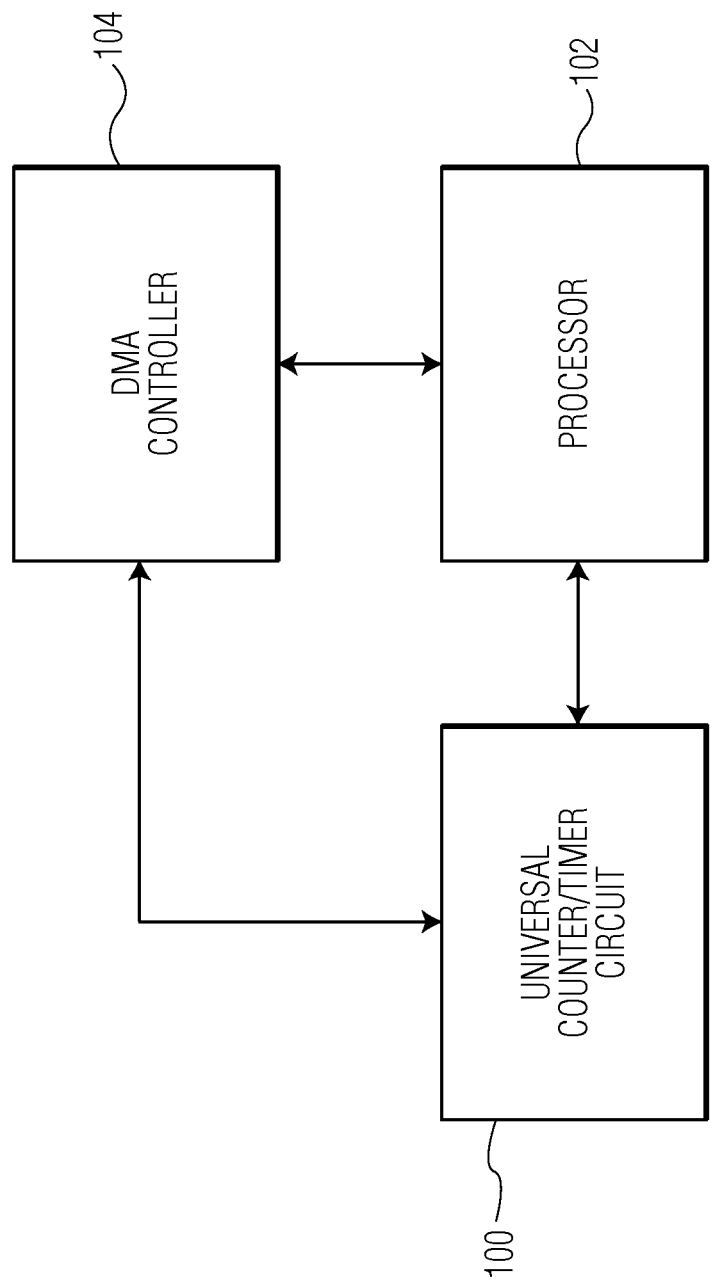
FIG. 1 is a block diagram showing a universal counter/timer circuit with a processor and a direct memory access (DMA) controller in accordance with an embodiment of the invention.

With reference to FIG. 1, a universal counter/timer circuit 100 in accordance with an embodiment of the invention is described. The universal counter/timer circuit is designed to be customizable to provide timing information, counting information, output signal modulation and/or input capture results for various applications. Thus, the universal counter/timer circuit can be configured to provide output signals for a particular application, such as motor control, without having to redesign the circuit for each application. Consequently, development costs of circuits for different applications can be significantly reduced using the universal counter/timer circuit.

As shown in FIG. 1, the universal counter/timer circuit 100 operates with a processor 102 and a direct memory access (DMA) controller 104. The processor configures the universal counter/timer circuit and performs various supporting operations for it. The processor may also receive one or more output signals from the universal counter/timer circuit, or these signals may be transmitted to other module(s) not shown in FIG. 1. The DMA controller 104 may be connected to the universal counter/timer circuit to load values into select registers of the universal counter/timer circuit, which may be in response to DMA requests from the universal counter/timer circuit. The DMA controller 104 may also be triggered by output signals from the universal counter/timer circuit, to perform data transfers that do not otherwise involve the universal timer.

Figure 2:
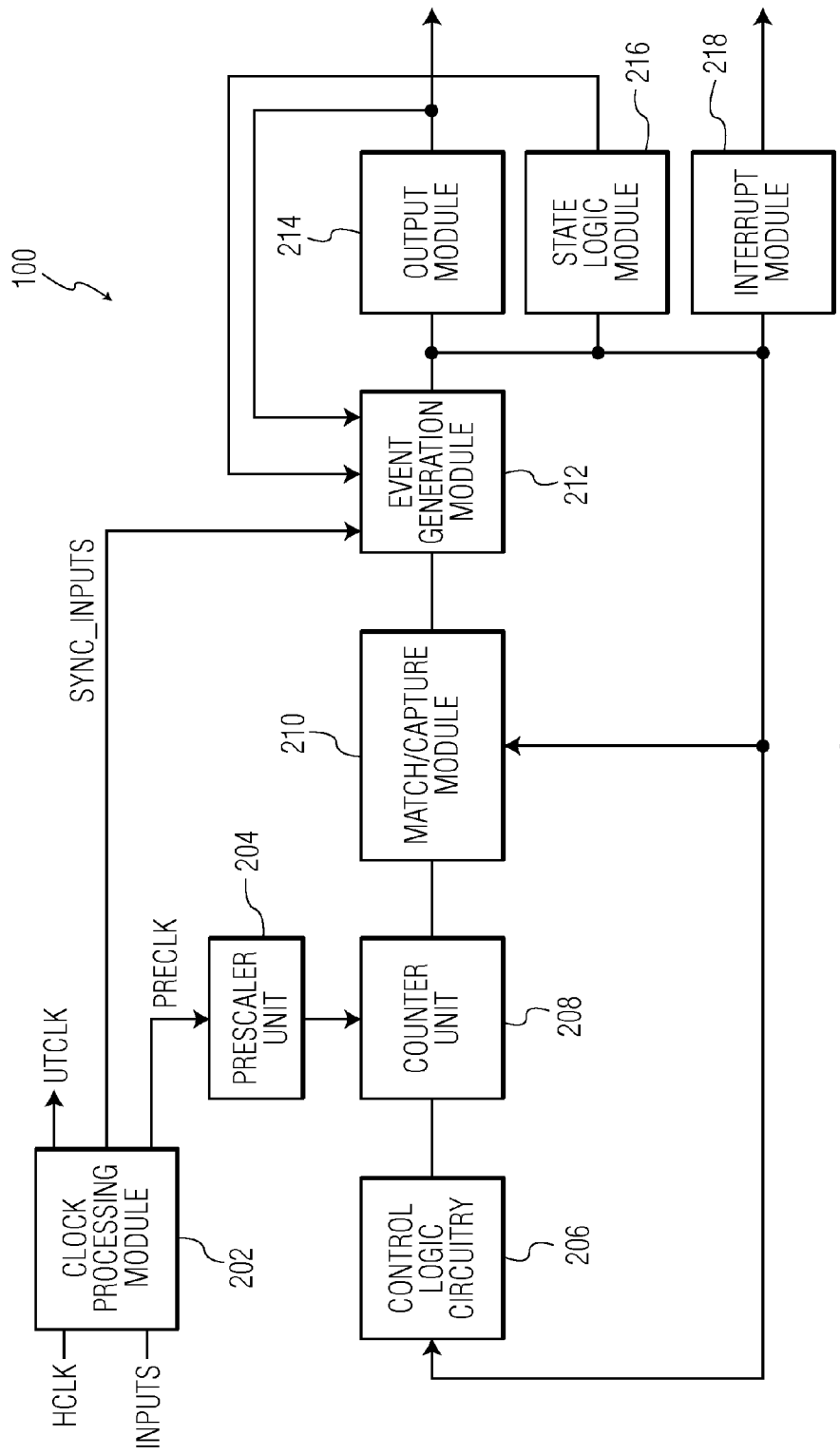
FIG. 2 is a block diagram of the components of the universal counter/timer circuit in accordance with an embodiment of the invention.

Turning now to FIG. 2, components of the universal counter/timer circuit 100 in accordance with an embodiment of the invention are depicted. As shown in FIG. 2, the universal counter/timer circuit includes a clock processing module 202, a prescaler unit 204, control logic circuitry 206, a counter unit 208, a match/capture module 210, an event generation module 212, an output module 214, state logic module 216 and an interrupt module 218. Although the components of the universal counter/timer circuit are illustrated in FIG. 1 as being separate modules, these modules are typically integrated into a single universal counter/timer circuit.

The clock processing module 202 of the universal counter/timer circuit 100 includes two inputs to receive an external clock signal "HCLK" (e.g., the bus clock used by the processor 102) and a multiplicity of input signals "INPUTS" and outputs to output an internal clock signal "UTCLK" for various components of the universal counter/timer circuit, a multiplicity of synchronized input signals "SYNC_INPUT" for the event generation module 212 and a prescaler clock signal "PRECLK" for the prescalers. In some embodiments, the UTCLK and PRECLK clock signals differ from the external HCLK clock signal with respect to frequency. However, in other embodiments, one or both of the UTCLK and PRECLK clock signals may be equivalent to the external HCLK clock signal with respect to frequency.

The prescaler unit 204 of the universal counter/timer circuit 100 operates to produce one or more clock signals for the counter unit 208 using the PRECLK clock signal from the clock processing module 202. The prescaler unit includes one or more prescalers, similar to the counter unit 208, which includes one or more counters, as described below in more detail below with respect to FIG. 3. The number of prescalers included in the prescaler unit equals the number of counters included in the counter unit. Each prescaler is configured to provide a clock signal to the counter connected to that prescaler. Thus, depending on the number of counters in the counter unit, the prescalers generate a corresponding number of clock signals to be used by the counters.

The control logic circuitry 206 of the universal counter/timer circuit 100 operates to produce control signals to control each counter of the counter unit 208. The control signals determine when each counter is incremented, cleared, and loaded. The control logic circuitry 206 includes an input to receive event signals generated by the event generation module 212. The control logic circuitry is configured to provide appropriate control signals to the counter unit in response to different event signals, i.e., when certain events occur.

The counter unit 208 of the universal counter/timer circuit 100 operates to produce one or more running count values. As mentioned above, the counter unit includes one or more counters, depending on the configuration of the universal counter/timer circuit. The counter unit is described herein as being configurable to function as a single 32-bit counter or two 16-bit counters. However, in other embodiments, the counter unit may also be configurable to function as four 8-bit counters or one 16-bit and two 8-bit counters. In general, the counter unit may be configurable to function as M N-bit counters, where M and N are positive integers. Each counter of the counter unit is connected to one of the prescalers of the prescaler unit 204 to receive the clock signal from that prescaler. Each counter is also connected to the control logic circuitry 206 to receive the control signals from the control logic circuitry. Thus, each counter maintains a count value using the clock signal from the connected prescaler and using the control signals from the control logic circuitry.

Figure 3:
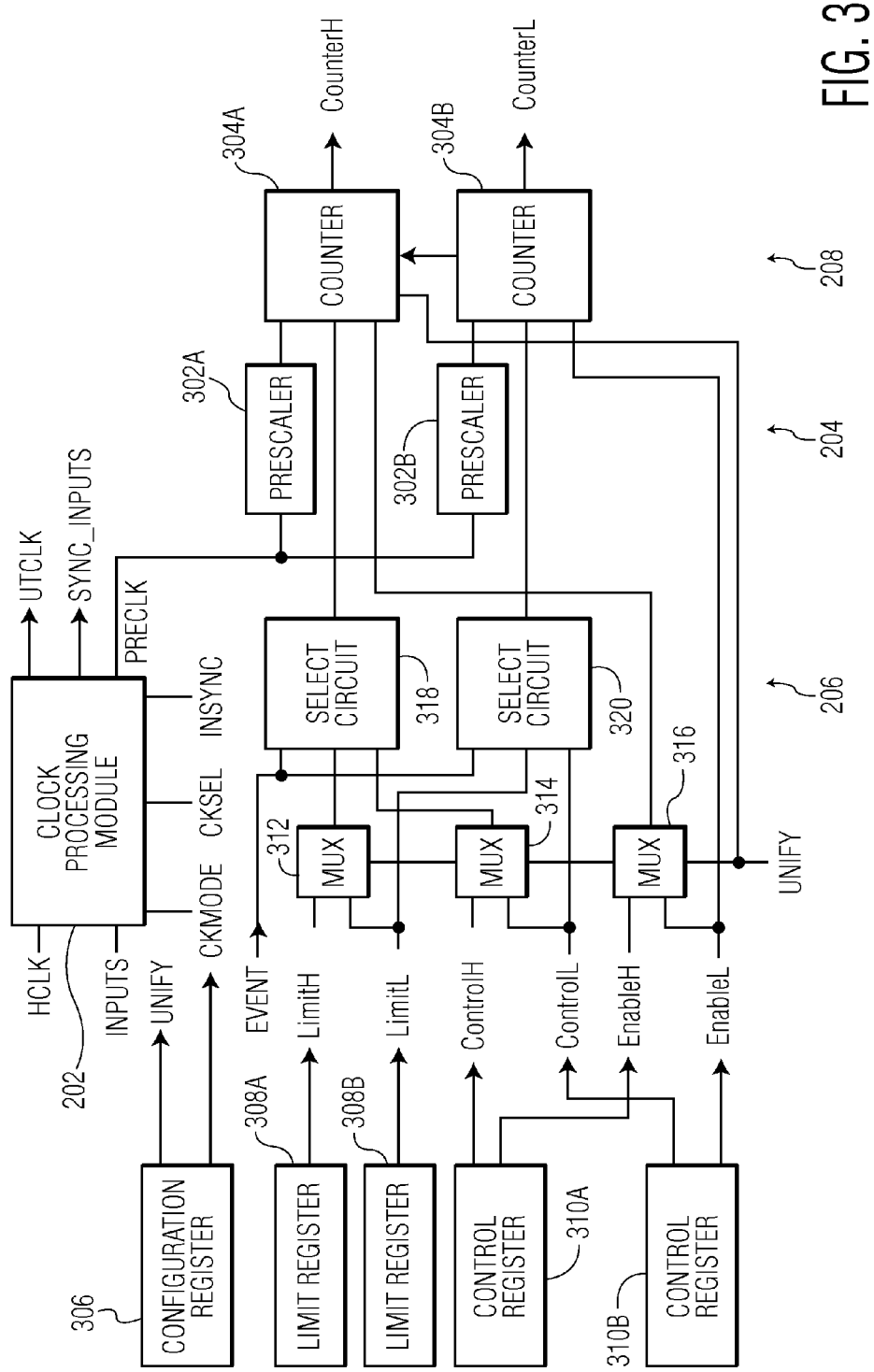
FIG. 3 is a block diagram of a clock processing module, a prescaler unit, a control logic circuit and a counter unit of the universal counter/timer circuit in accordance with an embodiment of the invention.

The clock processing module 202, the prescaler unit 204, the control logic circuitry 206 and the counter unit 208 in accordance with a particular embodiment are shown FIG. 3. In this embodiment, the universal counter/timer circuit 100 is configurable to use either one single unified 32-bit counter or two 16-bit counters. Thus, the prescaler unit includes two prescalers 302A and 302B and the counter unit includes two counters 304A and 304B. Depending on the configuration, the universal counter/timer circuit uses two output count values from the counters 304A and 304B as separate count value signals "CounterH" and "CounterL" or as a single unified count value signal "CounterU."

As illustrated in FIG. 3, the clock processing module 202, the control logic circuitry 206 and the counters 304A and 304B use various signals and values which are stored in registers of the universal counter/timer circuit 100. These registers include a configuration register 306, limit registers 308A and 308B and control registers 310A and 310B.

The configuration register 306 includes different bits and fields that configure the overall operation of the universal counter/timer circuit 100. The configuration register configures the universal counter/timer circuit to operate as two separate independent 16-bit counters or as a single unified 32-bit counter. The configuration register further configures the clock processing module 202 to produce the UTCLK, PRECLK and SYNC_INPUT signals, which may depend on the HCLK clock signal and/or the INPUT signal. In a particular implementation, the configuration register contains UNIFY, CKMODE, CKSEL and INSYNC bits and fields, as described in the table below.

| Bit | Name | Description | Reset Value |
|---|---|---|---|
| 0 | UNIFY | 0 the universal counter/timer circuit ("UT") operates as two 16-bit counters named H and L<br>1 the UT operates as a unified 32-bit counter named U | 0 |
| 2:1 | CKMODE | 00 "bus clocking" - the UT and pre-scalar(s) are clocked by the bus clock.<br>01 "high-performance sampled external clocking" - the UT clock is the bus clock, but the prescalar(s) is(are) enabled to count only when sampling of the input selected by the CKSEL field finds the selected edge. The minimum pulse width on the clock input is 1 bus clock period.<br>10 "low-power sampled external clocking" - the UT and pre-scalar(s) are clocked by the input selected by CKSEL, synchronized to the bus clock and possibly inverted. The minimum pulse width on the clock input is 1 bus clock period.<br>11 "direct external clocking" - the UT and prescalar(s) are clocked by the input edge selected by the CKSEL field. In this mode:<br>most of the UT is clocked by the (selected polarity of the) input, outputs are switched synchronously to the input clock, and the input clock rate must be at least half the bus clock rate, and can be faster than the bus clock. | 00 |
| 7:4 | CKSEL | When the CKMODE field is non-zero, this field selects the input clock:<br>0000 rising edges on input 0<br>0001 falling edges on input 0<br>0010 rising edges on input 1<br>0011 falling edges on input 1<br>... (thru nIN * 2 − 1) | 0000 |
| nIN + 7:8 | INSYNC | A 1 in one of these bits subjects the corresponding input to synchronization to the UT clock, before it is used to create an event. If an input is synchronous to the UT clock, keep its bit 0 for faster response. Bit 8 controls input 0, bit 9 controls input 1, etc. When the CKMODE field is 1x, the bit in this field, corresponding to the input selected by the CKSEL field, is not used. | all ones |

The limit registers 308A and 308B are used to store limit mask values for the counters 304A and 304B, selecting which events identify an upper limit for each counter value. The limit mask stored in the limit register 308A is referred to herein as a LimitH mask. The limit mask stored in the limit register 308B is referred to herein as a LimitL mask. Only the LimitL mask stored in the limit register 308B is used when the counters are operating as a unified counter, e.g., when the UNIFY signal is a "1." However, the LimitH and LimitL values stored in both of the limit registers are used when the counters are operating as separate counters, e.g., when the UNIFY signal is a "0." Both of the limit registers can be accessed by a single 32-bit read or write operation, or the limit registers they can be read or written individually.

The control registers 310A and 310B are used to store various control values for the counters 304A and 304B. The control values stored in the control register 310A are referred to herein as ControlH values or signals, which include stop and halt signals, from which an EnableH signal is derived, which enables counter 304A to count. The control values stored in the control register 310B are referred to herein as ControlL values or signals, which include stop and halt signals, from which an EnableL signal is derived, which enables the counter 304B to count. Only the ControlL and EnableL values stored in the control register 310B are used when the counters are operating as a unified counter, e.g., when the UNIFY signal is a "1." However, the ControlH, ControlL, EnableH and EnableL values stored in both of the control registers are used when the counters are operating as separate counters, e.g., when the UNIFY signal is a "0." Both of the control registers can be accessed by a single 32-bit read or write operation, or the limit registers they can be read or written individually.

In the embodiment illustrated in FIG. 3, the control logic circuitry 206 includes three multiplexers 312, 314 and 316 and two select circuits 318 and 320. The multiplexer 312 includes two inputs to receive limit event masks for the counters 304A and 304B, i.e., the LimitH and LimitL event masks from the limit registers 308A and 308B, respectively. The limit event masks are written into the limit registers 308A and 308B by the processor software. The output of the multiplexer 312 is connected to an input of the select circuit 318. The multiplexer 314 includes two inputs to receive control signals for the two counters, i.e., the ControlH and ControlL signals from the control registers 310A and 310B, respectively. The control signals are written into to the control registers 310A and 310B by the processor software. The output of the multiplexer 314 is connected to another input of the select circuit 318. The multiplexer 316 includes two inputs to receive the EnableH and EnableL signals from the control registers 310A and 310B, respectively. The output of the multiplexer 316 is connected to an input of the counter 304A. Each of the multiplexers 312, 314 and 316 selects between the "L" and "H" versions of a signal or value based on the UNIFY signal, which indicates whether the universal counter/timer circuit 100 is configured to operate as a unified 32-bit counter or as two 16-bit counters. The UNIFY signal functions as the select signal for the multiplexers 312, 314 and 316. The UNIFY signal is sourced by the configuration register 306.

The select circuit 318 includes inputs from the multiplexer 312, comprising an event mask for the counter limit, and from the multiplexer 314, comprising the control signals that apply to the H counter. The select circuit 318 further includes inputs to receive event signals "EVENTS" from the event generation module 212. The outputs of the select circuit 318 control the counter 304A. The select circuit 320 also includes inputs to receive the EVENT signals. The select circuit 320 further includes inputs to receive the ControlL signals and LimitL event mask for the counter 304B. The outputs of the select circuit 320 control the counter 304B.

Each of the counters 304A and 304B includes inputs to receive the clock signal from the corresponding prescaler 302A and 302B and the control signals from the select circuits 318 and 320, plus an enable input. For the counter 304B, the enable is simply the EnableL signal derived from the control register 310B, while for the counter 304A, the enable may be the EnableL or EnableH signal as selected by the multiplexer 316. Thus, the counters 304A and 304B generate the CounterH and CounterL values using these input signals. When the counters 304A and 304B are operating as two separate independent counters, the CounterL and CounterH values are independent values. When the counters are operating as a unified counter, the CounterL value represents the least significant 16 bits and the CounterH value represents the most significant 16 bits of the unified CounterU value. Thus, when operating as a unified counter, the counter 304B provides a carry output to the counter 304A so that the most significant 16 bits of the unified CounterU signal are incremented when the least significant 16 bits switch from all ones to all zeroes.

The counter 304A includes four inputs to receive the clock signal from the prescaler 302A, the output signal from the select circuit 318, the output signal from the multiplexer 316 and the UNIFY signal. Thus, the counter 304A generates the CounterH value using these input signals. When the counters 304A and 304B are operating as two separate independent counters, the CounterH value is independent of the CounterL value. When the counters are operating as a unified counter, the CounterL value represents the most significant 16 bits of the unified CounterU value.

In operation, when the UNIFY signal indicates that the counters 304A and 304 are operating as two separate counters, the multiplexers 312, 314 and 316 output the LimitH, ControlH and EnableH signals, respectively. When the UNIFY signal indicates that the counters are operating as a unified counter, the multiplexers 312, 314 and 316 outputs the LimitL, ControlL and EnableL signals, respectively. The select circuit 318 outputs control signals for the counter 304A that depends on the EVENT, LimitH, LimitL, ControlH and/or ControlL signals. The select circuit 320 outputs control signals for the counter 304B that depend on the EVENT, LimitL, and ControlL signals. Depending on the control signals from the select circuits, the counters generate the CounterH and CounterL values using the clock signals from the prescalers 302A and 302B. As described above, the CounterH and CounterL values are independent when the counters are operating as two independent counters. However, the CounterH and CounterL signals represent parts of a single unified count value when the counters are operating as a single unified counter.

Turning back to FIG. 2, the match/capture module 210 is connected to the counter unit 208 to receive the CounterH and CounterL values, which may represent two separate count values or a unified count value. Each match/capture module is configured to store values that specify match or capture conditions, depending on one of the bits in register mode registers (not shown). The match/capture module performs either the match or capture function using the stored values for the match or capture conditions.

Figure 4:
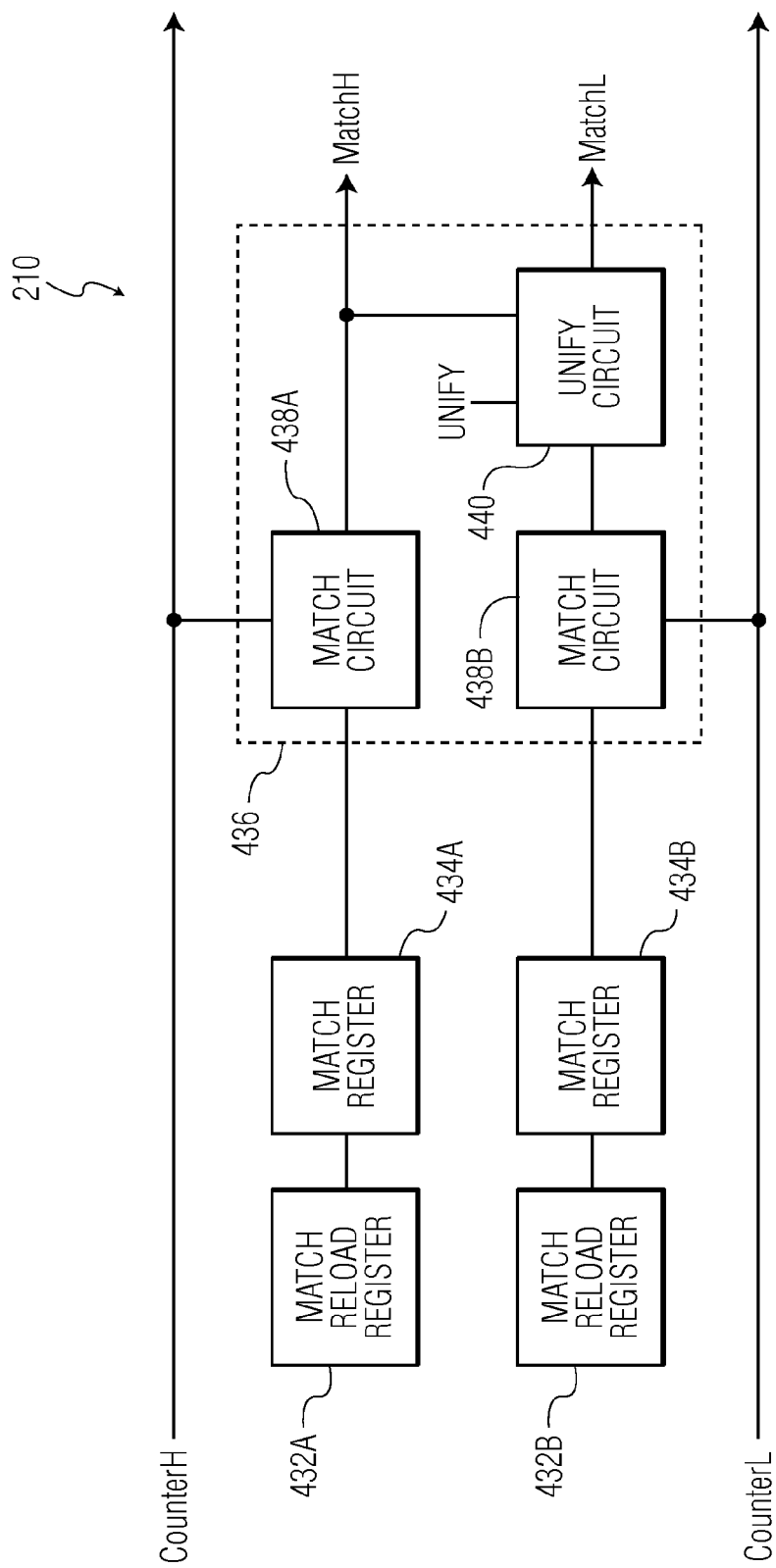
FIG. 4 is a block diagram of a match/capture module of the universal counter/timer circuit when the module is configured to perform match operations in accordance with an embodiment of the invention.

FIG. 4 shows the match/capture module 210 when it is configured to perform match operations in accordance with an embodiment of the invention. As shown in FIG. 4, the match/capture module includes match reload registers 432A and 432B, match registers 434A and 434B, and match logic circuitry 436, which includes match circuits 438A and 438B and a unify circuit 440.

The match registers 434A and 434B hold two 16-bit values for match comparison. The values in the match registers may be loaded by the processor 102, or from the respective match reload registers 432A and 432B, which receive values to be loaded into the match registers for match comparison. The 16-bit values in the match registers are compared to the respective counter values, i.e., the CounterH and CounterL values by the match circuits 438A and 438B. The results of the two comparisons are present on the outputs of the match circuits. The unify circuit 440 is effectively turned off when the counters are operating as separate counters. Thus, the match result signals are output as two signals, MatchH and Match L signals. When the counters are operating as a unified counter, the match registers hold a 32-bit value that is compared to the unified count value by the match circuits, and the unify circuit ANDs the outputs of the match circuits 438A and 438B to produce the overall 32-bit MatchL result.

Figure 5:
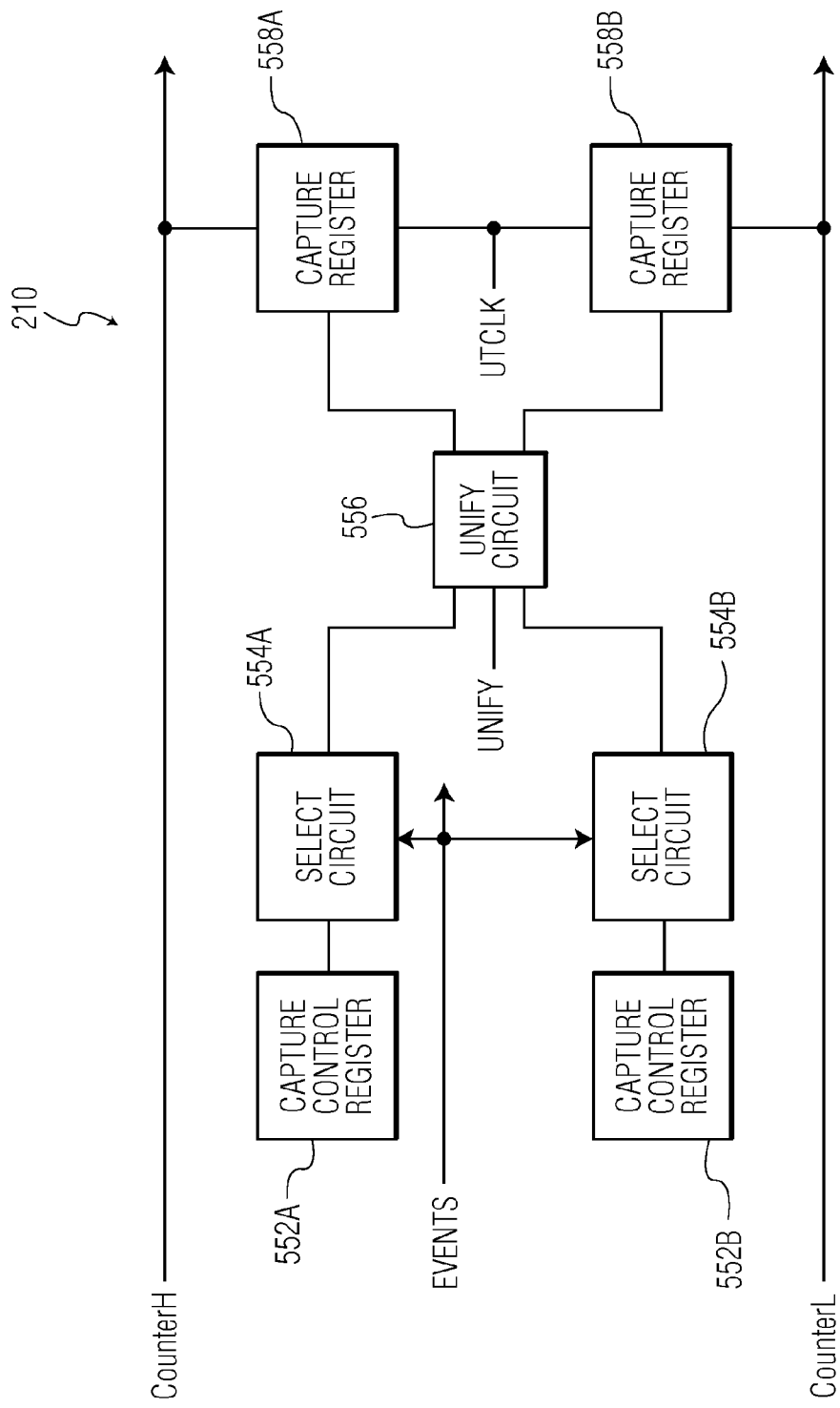
FIG. 5 is a block diagram of a match/capture module when the module is configured to perform capture operations in accordance with an embodiment of the invention.

FIG. 5 shows the match/capture module 210 when it is configured to perform capture operations in accordance with an embodiment of the invention. As shown in FIG. 5, the match/capture module includes capture control registers 552A and 552B, select circuits 554A and 554B, a unify select circuit 556 and capture registers 558A and 558B.

The capture control registers 552A and 552B control which events load (i.e., capture) count values from the counters 304A and 304B into the corresponding capture registers 558A and 558B. The select circuits 554A and 554B, which are connected to the capture control registers, have inputs to receive EVENT signals from the event generation module 212. Each select circuit asserts it "capture" output when a selected event has occurred. The capture outputs from the select circuits are sent to the unify circuit 440, which sends them to the capture registers as independent control signals to capture separate 16-bit count values in the corresponding capture registers when the counters are operating as separate counters. When the UNIFY signal is 1, the unify circuit 556 ANDs the capture outputs from the select circuits to signal both capture registers to capture the unified 32-bit count value.

In an embodiment, the match registers 434A and 434B in FIG. 4 and the capture registers 558A and 558B in FIG. 5 are the same registers, as are the match reload resisters 432A and 432B in FIG. 4 and the capture control registers 552A and 552B in FIG. 5. The inputs and outputs of these registers are simply used differently by each match/capture module in accordance with its bit in the register mode register. This mechanism conserves silicon area and thus cost, while providing greater flexibility for applications, some of which may require more match functions and others more capture functions.

Figure 6:
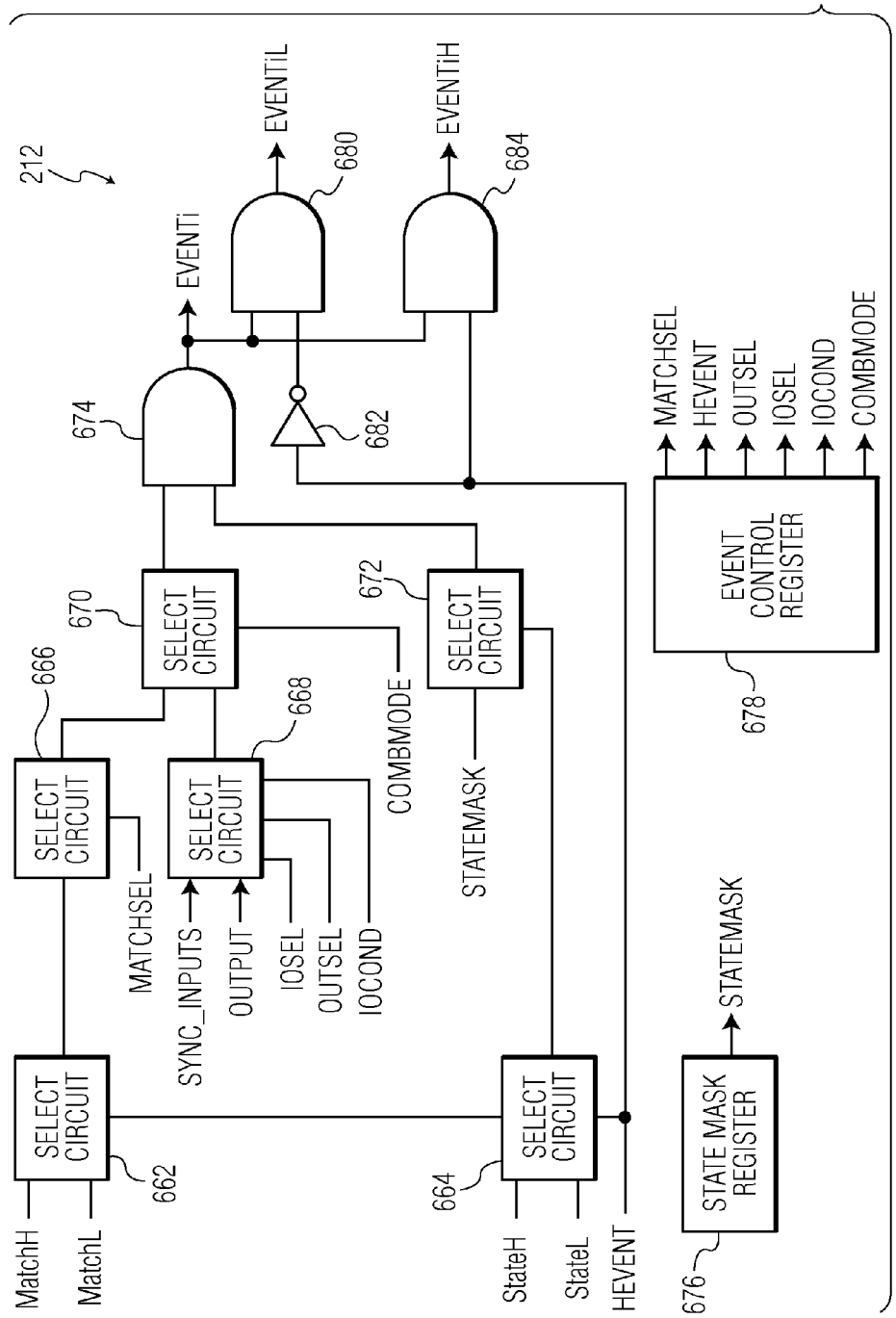
FIG. 6 is a block diagram of an event generation module of the universal counter/timer circuit in accordance with an embodiment of the invention.

FIG. 6 shows the components of the event generation module 212 in accordance with an embodiment of the invention. The event generation module generates EVENT signals depending on counter matches, input/output edges and state values. The EVENT signals from the event generation module can switch outputs, require interrupts and change state values.

The event generation module 212 in FIG. 2 includes a multiplicity of the individual event units shown in FIG. 6, each of which includes select circuits 662, 664, 666, 668, 670 and 672 and an AND logic gate 674. The individual event units use signals from a state mask register 676 and an event control register 678. The state mask register 676 provides STATEMASK signal, as explained below. The event control register 678 provides MATCHSEL, HEVENT, OUTSEL, IOSEL, IOCOND and COMBMODE signals, as also explained below.

The select circuit 662 includes two sets of inputs to receive the MatchH and MatchL signals from all of the match/capture modules 210. The select circuit 662 includes another input to receive a HEVENT signal from the state mask register 676, which controls the selection of either the MatchH signals or the MatchL signals for the select circuit 662. Similarly, the select circuit 664 also includes two inputs to receive two state values, a StateH value and a StateL value, from the state logic circuitry 216, which includes registers to store these state values. These state variables or values, i.e., the StateH and StateL values, indicate the current states of the applications of the counters 304A and 304B. The select circuit 664 also includes another input to receive the HEVENT signal from the event control register 678, which controls the selection of either the StateH value or the StateL value to be sent to the Select circuit 672.

The output of the select circuit 662 is connected to the input of the select circuit 666, which also has an input to receive a MATCHSEL value from the event control register 678. The MATCHSEL value selects one of the match signals from a match/capture module associated with the current event (if any). Thus, the select circuit 666 outputs the match signal selected by the MATCHSEL value. The output of the select signal 666 represents the "match component" of this event, and is connected to an input of the select circuit 670.

The state-value output from the select circuit 664 is connected to an input of the select circuit 672, which also has an input to receive the STATEMASK value from the state mask register 676. Select circuit 672 outputs the bit of the STATEMASK value, that is selected by the state value from Select circuit 664. This output is one of the two inputs of the AND logic gate 674 that produces the EVENT output of this event unit.

The select circuit 668 includes a set of inputs to receive the synchronized input signals, i.e., the SYNC_INPUT signals, from the clock processing module 202 and a set of inputs to receive the output signals from the output module 214. The select circuit 668 further includes inputs to receive IOSEL, OUTSEL and IOCOND signals from the event control register 678. The OUTSEL signal selects either the synchronized input signals or the output signals of the universal counter/timer circuit 100, as an ingredient of this event. The IOSEL value selects a particular input or output as an ingredient of this event. The IOCOND value controls which state of the selected input or output signal enables this event: a low level, rising edge, falling edge, or high level. The output of the select circuit 668 represents the "I/O component" of this event, and is connected to an input of the select circuit 670.

The select circuit 670 includes two inputs to receive the outputs from the two select circuits 666 and 668. The select circuit 670 further uses the COMBMODE value from the event control register 678, which controls the selection of how these match and I/O components are used or combined from the following selections: OR (match and/or I/O component), MATCH (match component only), IO (I/O component only) and AND (simultaneous match and I/O component). The output of the select circuit 670 is connected to an input of the AND logic gate 674.

The AND logic gate 674 includes inputs to receive the outputs from the select circuits 670 and 672. When the selected match/IO event occurs, and the (selected L or H) state is enabled for this event by the event state mask register for this event, the AND logic gate outputs an EVENTi signal, which can be used to switch outputs, request interrupts, start, strop, or limit the counter(s), and change state values. The EVENTi signal is further differentiated into an EVENTiL signal that is asserted if the HEVENT bit for this event is 0 using an AND logic gate 680 on the EVENTi signal and an inverted HEVENT bit from an inverter 682, which inverts the HEVENT bit, and an EVENTiH signal that is asserted if the HEVENT bit for this event is 1 using an AND logic gate 684 on the EVENTi signal and the HEVENT bit.

Figure 7:
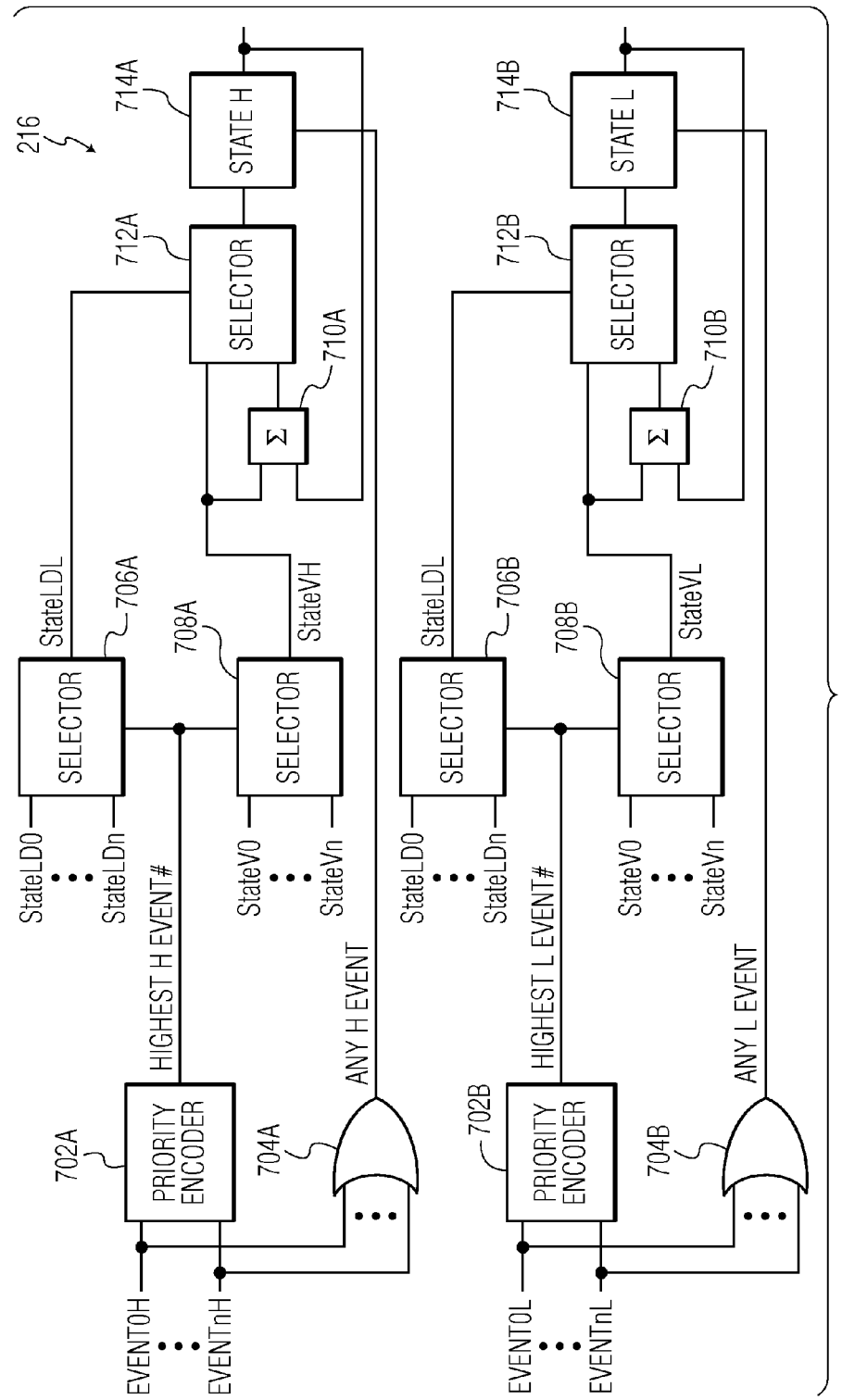
FIG. 7 is a block diagram of the state logic module of the universal counter/timer circuit in accordance with an embodiment of the invention.

The state logic module 216 is composed of the elements shown in FIG. 7 in accordance with an embodiment of the invention. As shown, there is a separate circuit for the L or unified counter, and one for the H counter that is used only when the UNIFY bit is 0. Each of these circuits for the L or unified counter and the H counter includes a priority encoder 702, an OR gate 704, selectors/multiplexors 706, 708 and 712, an adder 710 and a state register 714. The elements for the L or unified counter are labeled using the suffix "A", while the elements for the H counter are labeled using the suffix "B". All of the EVENTiL (or EVENTiH) signals from the event generation units are routed to the priority encoder 702 and to the OR gate 704. The priority encoder encodes the number of the highest event that is asserted for this counter, which is connected to the "select" inputs of the two selector/multiplexors 706 and 708. The selector/multiplexer 706 selects the STATELD bit from the highest event's event control register, while the selector/multiplexer 708 selects the STATEV value from that register. These selected signals plus the output of the OR gate 704 determine whether and how the state value is changed in each clock period. The adder 710 is of the same width as the state register 714; its output is the value of the state register plus the STATEV value. The selector/multiplexer 712 uses the STATELD signal to select between the output of the adder and the STATEV value itself. The state register 714 loads the output of the selector/multiplexer 712 as the new state value, in any clock in which the output of OR gate 704 indicates that there is at least one event for the associated counter.

Figure 8:
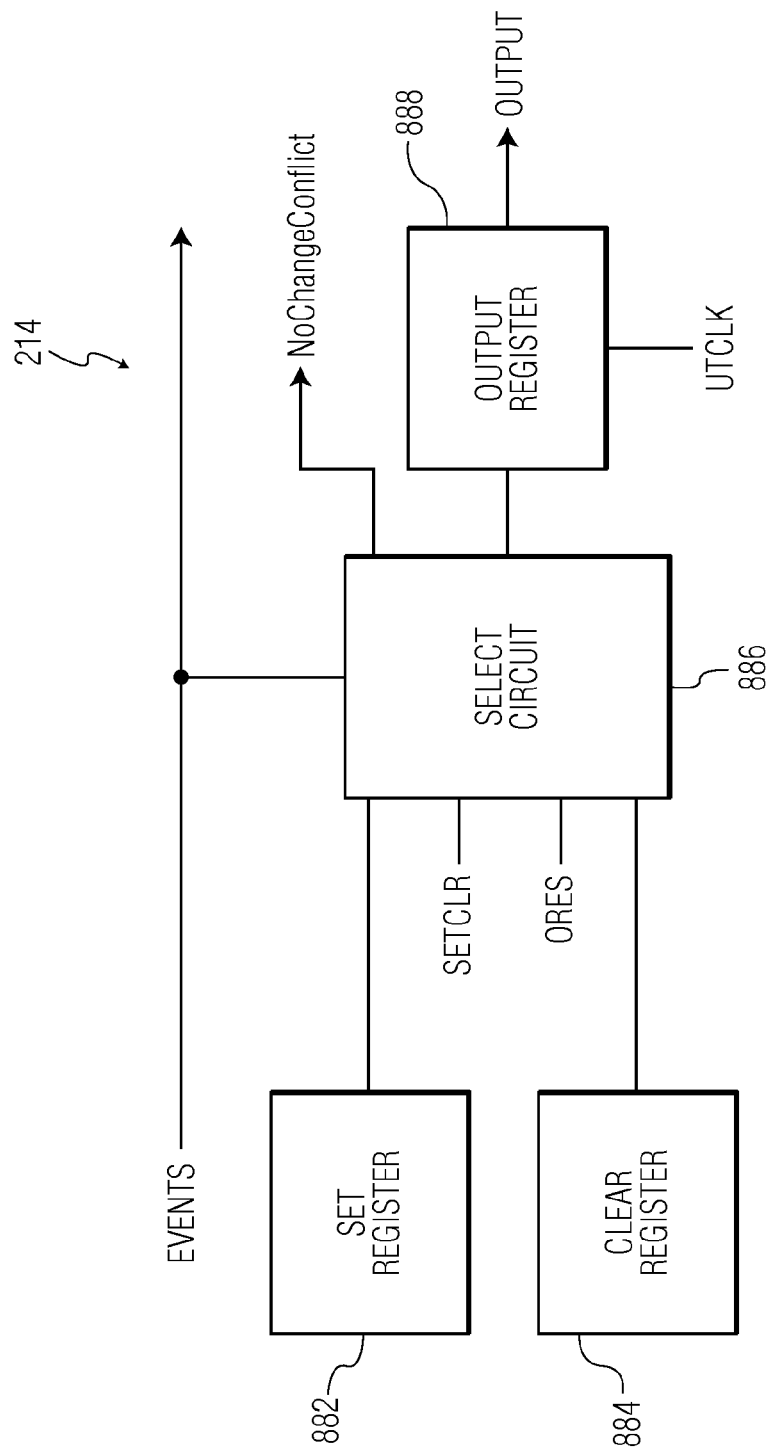
FIG. 8 is a block diagram of an output module of the universal counter/timer circuit in accordance with an embodiment of the invention.

The output module 214 is composed of a multiplicity of the individual output units shown in FIG. 8, in accordance with an embodiment of the invention. Each output unit includes a set register 882, a clear register 884, a select circuit 886 and an output register 888. The set register 882 is used to store an event mask to select which events "set" the output. The clear register 884 is used to store an event mask to select which events "clear" the output of the output unit. The select circuit 886 includes inputs that are connected to the set and clear registers to receive the event masks stored in the registers. The select circuit 886 further includes inputs to receive a 2-bit SETCLR field and a 2-bit ORES field from a bidirectional control register and a conflict resolution register of the overall universal timer, respectively. Each of these registers (not shown) includes 2 bits for each output unit. The SETCLR field specifies the impact of counting direction on the meaning of "set" and "clear" operations on the output of this unit. The SETCLR field can define the "set" and "clear" as one of the following: a. "set" and "clear" do not depend on any counter; b. "set" and "clear" are when reversed counter 304B is counting down; or c. "set" and "clear" are reversed when the counters are operating as separate counters and counter 304A is counting down. The ORES signal controls what happens when there is a conflict between "set" and "clear," i.e., when both setting and clearing occur simultaneously for this output. The ORES field controls the effect of simultaneous "set" and "clear" on an output as follows: (1) no change (aside from a possible interrupt as described subsequently), (2) set the output (or clear the output based on the SETCLR field), (3) clear the output (or set it based on the SETCLR field), and (4) toggle the output.

Figure 9:
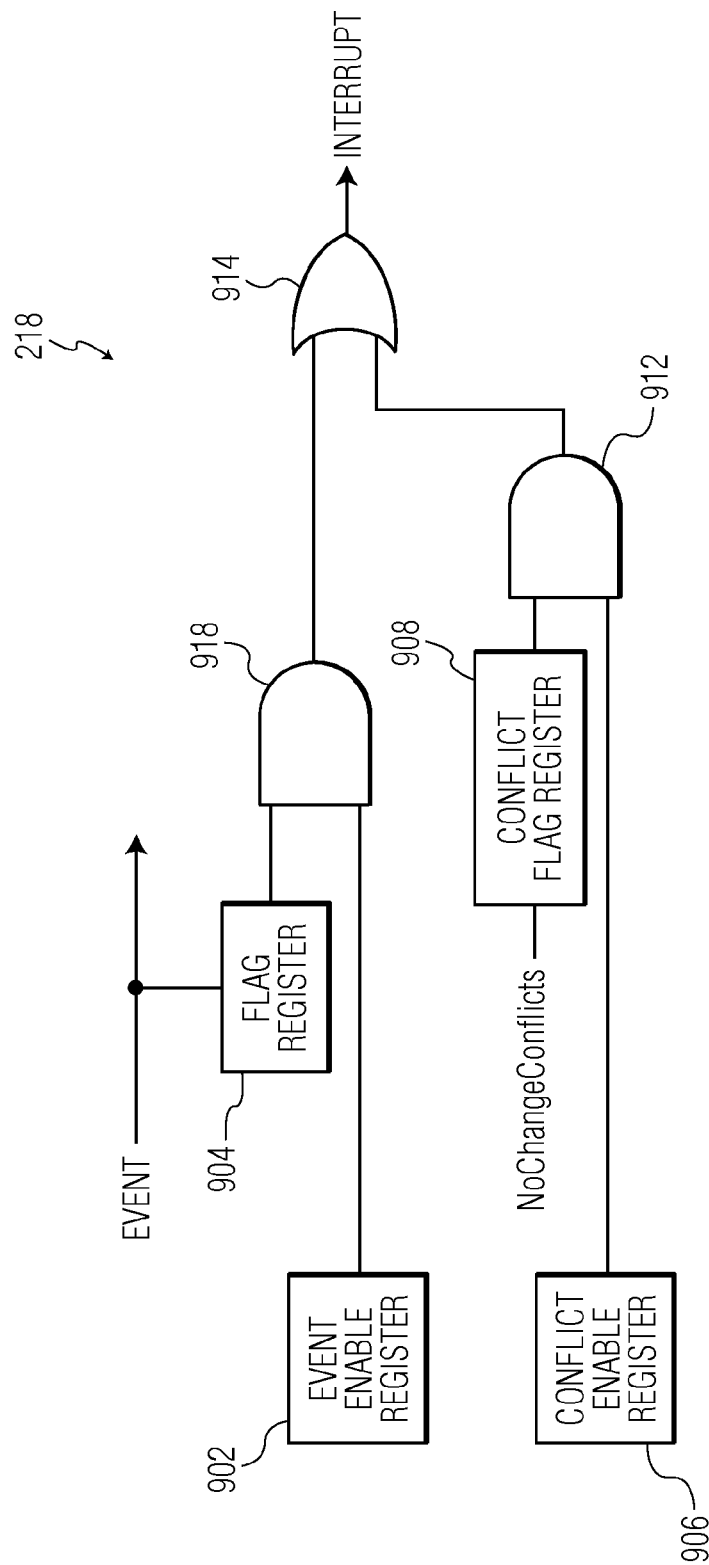
FIG. 9 is a block diagram of an interrupt module of the universal counter/timer circuit in accordance with an embodiment of the invention.

FIG. 9 shows the components of the interrupt module 218 in accordance with an embodiment of the invention. The components of the interrupt module operate to present an interrupt request to the associated processor 102. As shown in FIG. 9, the interrupt module includes an event enable register 902, an event flag register 904, a conflict enable register 906, a conflict flag register 908, AND logic gates 912 and 918 and an OR logic gate 914.

The event enable register 902 store an event mask that enables flags to request an interrupt. The event flag register receives EVENT signals from the event generation module 212 and "remembers" them until software clears this memory.

There is one AND gate 918 for each event embodied in the universal counter/timer circuit 100, and an interrupt is requested whenever any event is enabled and the flag bit for that event is set. Each AND gate 918 combines the output one bit of the flag register 904 and the corresponding bit of the event enable register 902. The outputs of all of the AND logic gate 918 are connected to the OR logic gate 914.

The conflict enable register 906 is used to store values to enable "no change conflict" signals to request interrupts. The conflict flag register 908 receives a NoChangeConflict signal from each of the individual output modules (FIG. 8), and remembers such conflicts until the memory is cleared by software. There is one AND logic gate 912 for each output of the universal timer. Each such gate requests an interrupt when corresponding bits of the Conflict Enable register and the conflict flag register are both set. The output of all of the AND logic gates 912 are connected to the OR logic gate 914. The output of the OR logic gate is the interrupt signal, which is transmitted to the processor 102 connected to the universal counter/timer circuit. This interrupt is requested when any of the AND gates 812 or 818 asserts its output.

Figure 10:
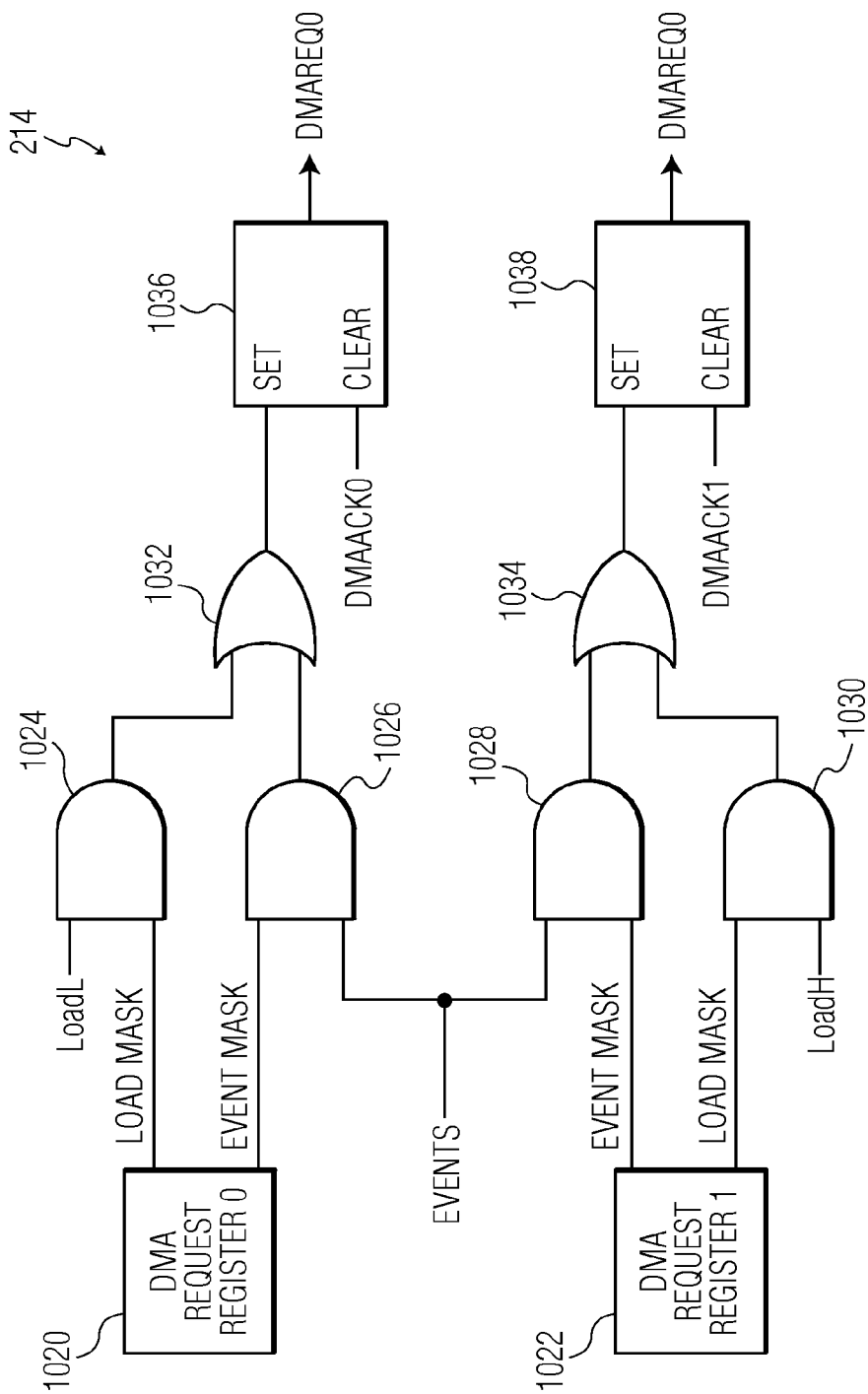
FIG. 10 shows two DMA request registers of the output module of FIG. 8 in accordance with an embodiment of the invention.

FIG. 10 shows two DMA request circuits 1020 and 1022 of the universal counter/timer circuit 100 in accordance with an embodiment of the invention. The DMA request registers 1020 and 1022 are connected to a set of AND gates 1024 and 1026, one for each event embodied in the universal counter/timer circuit. The other inputs of these AND gates are connected to the event generation module 212 to receive the EVENT signals. One additional bit in each DMA Request register is connected to AND gates 1024 and 1030, which enable DMA requests when match register 434B is loaded from the reload register 432B, as indicated by a received LoadH signal, and when match register 434A is loaded from the reload register 432A, as indicated by a received LoadL signal. The outputs of these N+1 AND gates are combined into a single "trigger DMA request" signal by the OR gates 1032 and 1034. The output registers 1036 and 1038 source the DMA requests to the DMA controller 104, which are cleared by the corresponding DMAACK signal.

In an embodiment, the match registers 434A and 434B, the match reload registers 432A and 432B, the capture registers 558A and 558B and the capture control registers 552A and 552B are arranged to receive and store consecutive words, with the standard division of each word into two half words. When the universal counter/timer circuit 100 is configured to operate as having two separate counters, these two half words are related to the counters 304A and 304B. Software, i.e., a program executed by the processor 102, has the option of writing words initially to set up both halves of the universal counter/timer circuit 100 simultaneously, or writing half words to set up each half separately.

The software can use the DMA controller 104 to write the match reload registers 432A and 432B, or to read the capture registers 558A and 558B. However, when the universal counter/timer circuit 100 is configured to operate as having two separate counters, the addressing of the half word registers is not compatible with many DMA controllers' requirement to use consecutive addresses for sequential-address operation. Thus, an alternate address map for half word accesses to the same registers can be used, which is compatible with such DMA controllers. When the universal counter/timer circuit is configured to operate as having a unified counter, DMA word accesses should be done using standard offsets.

The DMA controller 104 can be used to write one or more of the match reload registers 432A and 432B, or read one or more of the capture registers 558A and 558B, typically at the start of a counter cycle. DMA accesses to more than one match reload or capture register may require that the registers be consecutive registers.

In some embodiments, the configurable design of the universal counter/timer circuit 100 allows the counters 304A and 304B to operate as one 32-bit counter, two 16-bit counters, four 8-bit counters, or one 16-bit counter and two 8-bit counters, in accordance with the enabling of carry across the interbyte boundaries within a word. This is particularly advantageous on a processor that supports 32-bit, 16-bit, and 8-bit accesses, such that the counters and their supporting registers can be accessed in a unified or separate way, In this way, the same data lines are always used for reading and writing each bit of each register, eliminating the multiplexing of data lines that would be needed with alternative approaches.

In addition, the design of the universal counter/timer circuit 100 allows the use of a state variable as a higher-level control that is superior to the value of the counter in signifying the overall state associated with a counter. In this way, sequences involving multiple cycles of the timer-counter can be easily defined and controlled. Thus, for example, events can be enabled by any of the possible states of the variable, by use of a bit mask containing a "1" for each state in which the event can occur. Furthermore, events can in turn modify the state variable that is associated with the counter, by associating with each event:

a. a numeric field of the same width as the state variable,
   b. an indication of whether the numeric field is to be loaded into, or added to, the state variable when the event occurs, with
   c. "no change" implemented by adding zero to the state variable.

Additionally, because several events can occur in the same clock, that specify different changes to the state variable, a mechanism is needed for selecting which change should occur. In the universal counter/timer circuit, this is simply that the highest-numbered among the events determines the change to the state variable.

The design of the universal counter/timer circuit 100 also allows the use of abstract, non-dedicated events as a mechanism for specifying operations/changes in a timer/counter/PWM, wherein each event consists of an edge or level on an input or output signal, and/or a match to the counter, qualified by the current state associated with the counter. As an example, in a particular implementation, the following specifications are used.

a. Edges and levels of a selected input or output signal including rising edges, falling edges, high level, or low level.
   b. The input/output component of an event is combined with the match component of that event in terms of IO, MATCH, OR, or AND.
   c. Each event is associated with a particular counter for purposes of matching and effect upon the associated state variable. There is only one set of events for the universal timer, not a set for each counter.
   d. Each event is qualified to occur in any set of states associated with the counter, by a mask including one bit for each state.
   e. Selected events can modify the state of the following elements of the overall timer/counter module. Each such element has an associated mask including one bit for each state implemented in the overall timer/counter/PWM module:
     1. Changing the state variable associated with the selected counter.
     2. Switching an output signal high or low, or toggling its state (this decision optionally being affected by the direction in which the associated counter is counting).
     3. Specifying when a capture register should capture the value in the counter with which it is associated.

4. Specifying when the associated counter has reached a limiting value, after which it is cleared to zero or counted back down to zero.
5. Specifying when the associated counter should be placed in either of two inactive states:
   i. pause state, from which it can be restarted by another event, or
   ii. halt state, from which it can be restarted only by software action.
6. Specifying when the associated counter should be restarted from pause state.
7. Specifying when interrupt should be requested of the processor (e.g., microprocessor or microcontroller) that is controlling the timer/counter/PWM module.
8. Specifying when DMA operation should be requested, for the purposes of writing new match values to the match registers, or reading capture registers.

The design of the universal counter/timer circuit 100 further allows the use of a mechanism for controlling output signals, wherein separate event masks for setting and clearing each output are included. This mechanism has the side-effect that simultaneous setting and clearing of the same output can be indicated in the same clock period. The universal timer includes a "conflict resolution" register containing two bits for each output, the four states of which select what happens when setting and clearing are both indicated:
   a. The output is not changed in this case, but a special debugging interrupt can be requested.
   b. The output is set in this case,
   c. The output is cleared in this case, or
   d. The output is toggled in this case.

The mechanism for controlling output signals further includes a "bidirectional control" register containing two bits for each output, which select among three possibilities for the effect of the counting direction of the associated counter on the meaning of "setting" and "clearing" the output as described above:
   a. The meaning of "set" and "clear" do not depend on the counting direction of any counter.
   b. The meaning "set" and "clear" are reversed when the "unified" or "lower" counter is counting down,
   c. The meaning "set" and "clear" are reversed when the "upper" counter is counting down.

The design of the universal counter/timer circuit 100 further allows the use of a counter-timer in which the prescalars and other elements may be clocked by the internal bus clock or an input signal, wherein clocking by the input signal can be qualified in three different ways:
   a. Unqualified/asynchronous: the selected edge of the input signal clocks the prescalars and other elements asynchronously from the bus clock.
   b. High-performance sampled clock: most of the storage elements are clocked by the bus clock, but the counter (or its prescalar if there is one) is only enabled when the input signal sampled by the bus clock shows a selected edge.
   c. Low-power sampled clock: the storage elements are clocked by the input signal sampled by the bus clock.

The design of the universal counter/timer circuit 100 further allows the use of an event-driven interrupt request facility, which is augmented by an additional facility whereby interrupt can also be requested when simultaneous setting and clearing occur for an output and the conflict resolution register indicates "no change" for the output. This feature helps a programmer who has setup the subject timer/counter module in such a way that such simultaneity should not occur, determine if such an unexpected situation ever occurs.

Figure 11:
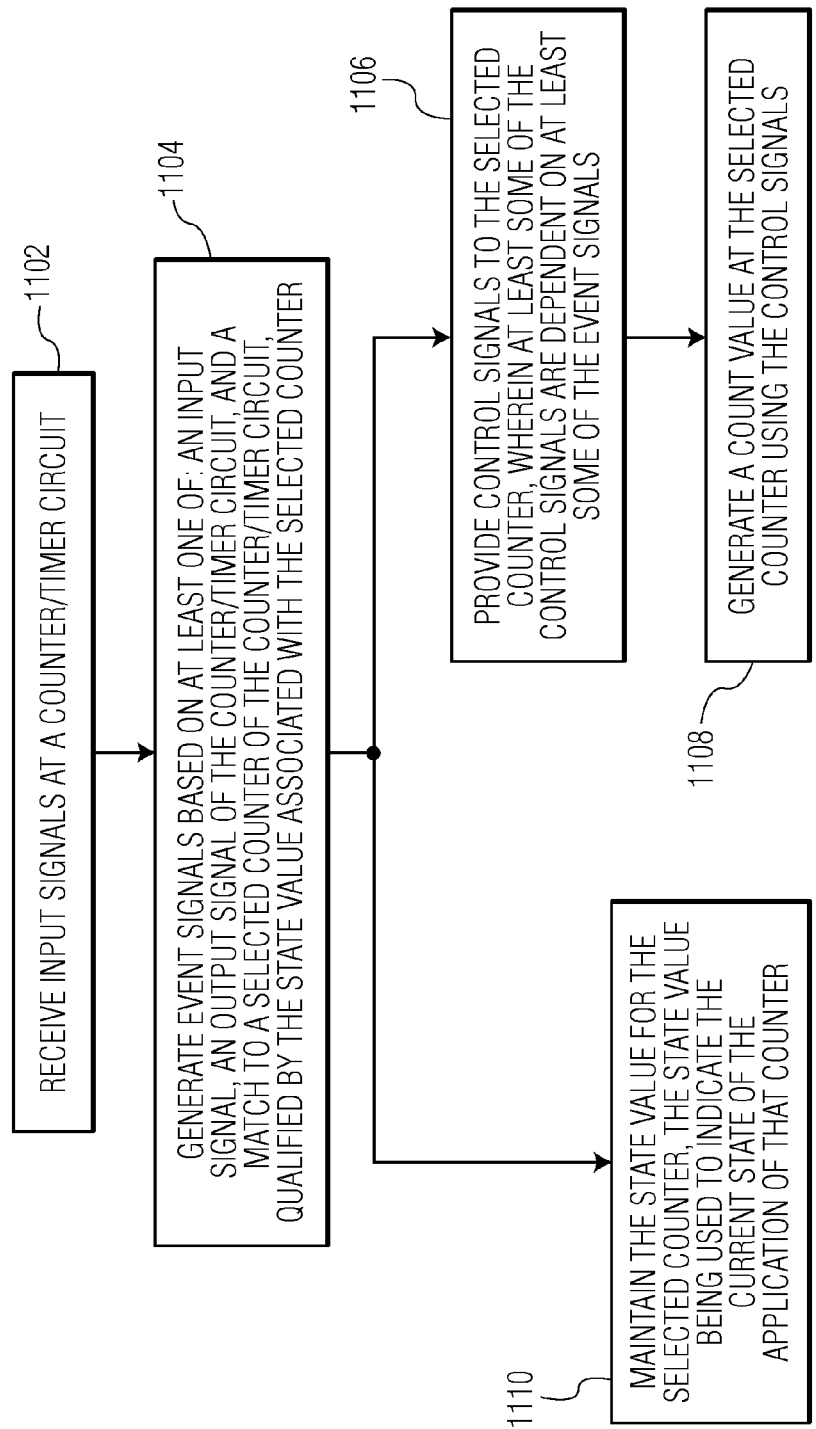
FIG. 11 is a process flow diagram of a method of generating timed output signals using a counter/timer circuit in accordance with an embodiment of the invention.

A method for generating timed output signals using a counter/timer circuit in accordance with an embodiment of the invention is described with reference to a process flow diagram of FIG. 11. At block 1102, input signals are received at the counter/timer circuit. At block 1104, event signals are generated based on at least one of: an input signal, an output signal of the counter/timer circuit, and a match to a selected counter of the counter/timer circuit, qualified by the state value associated with the selected counter. At block 1006, control signals are provided to the selected counter, wherein at least some of the control signals are dependent on at least some of the event signals. At block 1108, a count value is generated at the selected counter using the control signals. At block 1110, the state value for the selected counter is maintained as specified for the highest-numbered active event signal. The state value is used to indicate the current state of the application of the counter.

Although the operations of the method herein are shown and described in a particular order, the order of the operations of the method may be altered so that certain operations may be performed in an inverse order or so that certain operations may be performed, at least in part, concurrently with other operations.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A counter/timer circuit comprising:
   a counter unit having multiple counters that are configurable to operate as one or more counters;
   a state logic module configured to maintain a state value for each counter, the state value being used to indicate the current state of the application of that counter;
   an event generation module configured to generate event signals based on at least one of: an input signal, an output signal, and a counter match, qualified by one of the state values; and
   control logic circuitry connected to the counter unit to provide control signals for the counters of the counter unit, the control logic circuitry being also connected to the event generation module to receive the event signals so that at least some of the control signals are dependent on at least some of the event signals.

2. The counter/timer circuit of claim 1, wherein the counter unit includes first and second counters that are configurable to operate as a unified 32-bit counter or as two separate 16-bit counters.

3. The counter/timer circuit of claim 1, further comprising a match/capture module connected to the counter unit and the event generation module, the match/capture module comprising a plurality of match/capture units, each being configurable to perform match or capture operations with respect to count values generated by the counters of the counter unit.

4. The counter/timer circuit of claim 3, wherein a particular match/capture unit can be configured to perform match operations, the match/capture unit in this case including match reload registers, match registers and match circuits, the match load registers being configured to store values to be loaded into the match registers, the match circuits being connected to the match registers and the counters to compare count values from the counters with the match values stored in the match registers to produce match results.

5. The counter/timer circuit of claim 4, wherein the event generation module is configured to generate the event signals based on the match results of the match/capture module and/ or the states or transitions of selected input and/or output signals, each event being further qualified by a mask identifying a set of selected state values in which the event can occur.

6. The counter/timer circuit of claim 3, wherein a particular match/capture module is configured to perform capture operations, the match/capture unit in this case including capture control registers, select circuits and capture registers, the capture control registers being used to store control information that determines which event(s) cause the capture operations, and the capture registers being connected to the counters to capture count values from the counters in response to any of a set of selected events.

7. The counter/timer circuit of claim 1, further comprising an output module connected to the event generation module, the output module being configured to generate output signals based on the event signals from the event generation module, the output module being also configured to set and clear each output of the output module based on at least some of the event signals.

8. The counter/timer circuit of claim 1, further comprising an interrupt module connected to the event generation module, the interrupt module being configured to generate interrupt signals based on at least some of the event signals from the event generation module.

9. The counter/timer circuit of claim 7, wherein the output module is configured to output direct memory access requests based on at least some of the event signals generated by the event generation modules.

10. The counter/timer circuit of claim 1, further comprising a clock processing module configured to provide clock signals to different components of the counter/timer circuit, the clock processing module being also connected to provide synchronized input signals to the event generation module.

11. The counter/timer circuit of claim 10, wherein the clock processing module is configured to generate the clock signals by one of the following methods: bus clocking, direct external clocking, high-performance sampled clocking and low-power sampled external clocking.

12. A method of generating timed output signals using a counter/timer circuit, the method comprising:
receiving input signals at the counter/timer circuit;
maintaining a state value for each counter of the counter/timer circuit, the state value being used to indicate the current state of the application of that counter;
generating event signals based on at least one of: an input signal, an output signal of the counter/timer circuit, and a counter match, qualified by one of the state values associated with the counters;
providing control signals to the counters of the counter/timer circuit, wherein at least some of the control signals are dependent on at least some of the event signals; and
generating count values at the counters using the control signals, the count values representing a unified count value or separate count values depending on the configuration of the counter/timer circuit.

13. The method of claim 12, wherein generating the count values includes generating two counter values that represent a unified 32-bit count values or two separate 16-bit count values.

14. The method of claim 12, further comprising:
loading match values from match reload registers to match registers; and
comparing the count values from the counters with the values stored in the match registers to produce match results.

15. The method of claim 14, wherein generating the event signals includes generating the event signals based on match results and/or the states or transitions of input and/or output signals, event generation being further qualified by state masks that select the value(s) of the state variable in which each event can occur.

16. The method of claim 12, further comprising:
storing an event mask in capture control registers, the mask being used to determine which events are used for capturing operations;
capturing the count values from the counters based on the mask stored in the capture control registers and the event signals.

17. The method of claim 12, further comprising generating output signals based on the event signals, including performing set, clear, or toggle operations on each output of the counter/timer circuit.

18. The method of claim 17, further comprising generating interrupt signals based on at least some of the event signals.

19. The method of claim 12, further comprising outputting direct memory access requests based on at least some of the event signals, said requests determining when selected values are stored in one or more match reload registers that are in turn connected to the match registers.

20. The method of claim 12, further comprising providing clock signals to different components of the counter/timer circuit, wherein the clock signals are generated by one of the following methods: bus clocking, direct external clocking, high-performance sampled clocking and low-power sampled external clocking.

* * * * *